United States Patent [19]

Latz

[11] Patent Number: 5,244,559
[45] Date of Patent: Sep. 14, 1993

[54] APPARATUS FOR TRANSPORT AND HEAT TREATMENT OF SUBSTRATES

[75] Inventor: Rudolf Latz, Rodgau, Fed. Rep. of Germany

[73] Assignee: Leybold Aktiengesellschaft, Hanau, Fed. Rep. of Germany

[21] Appl. No.: 897,317

[22] Filed: Jun. 11, 1992

Related U.S. Application Data

[63] Continuation-in-part of Ser. No. 768,013, Sep. 30, 1991.

[30] Foreign Application Priority Data

Jul. 31, 1991 [DE] Fed. Rep. of Germany ....... 4125334
Feb. 4, 1992 [DE] Fed. Rep. of Germany ....... 4203080

[51] Int. Cl.$^5$ ............................................. C23C 14/34
[52] U.S. Cl. ........................... 204/298.09; 204/298.15; 204/298.25; 118/50.1; 118/719; 118/724; 118/729
[58] Field of Search ................ 204/298.09, 298.15, 204/298.23, 298.25, 298.26; 118/50.1, 719, 724, 725, 729

[56] References Cited

U.S. PATENT DOCUMENTS

| | | | |
|---|---|---|---|
| 3,907,660 | 9/1975 | Gillery | 204/298.09 |
| 4,042,128 | 8/1977 | Shrader | 214/17 |
| 4,381,965 | 5/1983 | Maher, Jr. et al. | 156/345 |
| 4,426,267 | 1/1984 | Münz et al. | 204/192 |
| 4,765,273 | 8/1988 | Anderle | 118/729 |
| 5,097,794 | 3/1992 | Mahler et al. | 118/719 |

FOREIGN PATENT DOCUMENTS

0346815 12/1989 European Pat. Off.

OTHER PUBLICATIONS

Fischer et al.: Taschenbuch Feingerätetechnik (1972) p. 186.

*Primary Examiner*—Nam K. Nguyen
*Attorney, Agent, or Firm*—Felfe & Lynch

[57] ABSTRACT

Substrate holders (16) having approximately plate-like, parallelepipedal configuration which can be moved in the vertical position along a given transport path through coating stations. The substrate holder (16) has frame-shaped sides parts (16a, 16b) disposed in parallel planes, in whose window-like openings (25, 26) the substrates (22, 23) are received. Wiping contacts (29, 29a and 30, 30a) are provided on stationary mountings (27, 28) and their resilient ends make contact with the electrically conductive coating (22a, 23a) upon movement through the station, and an electrical circuit can be closed briefly through these wiping contacts (29, 29a and 30, 30a) and the coating (22a, 23a), producing a heating and tempering of the material of the coating.

3 Claims, 1 Drawing Sheet

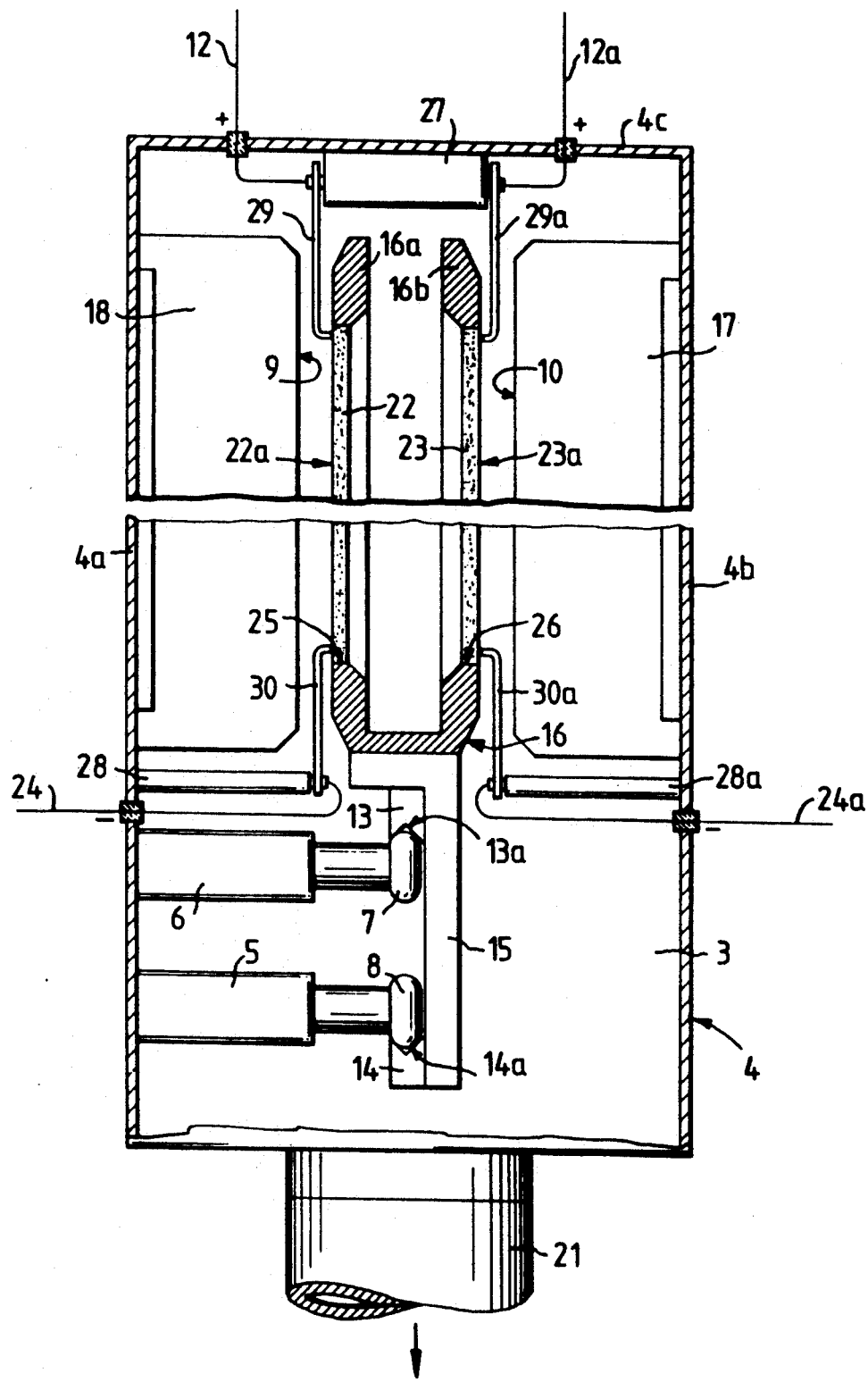

APPARATUS FOR TRANSPORT AND HEAT TREATMENT OF SUBSTRATES

This application is a continuation-in-part of U.S. application Ser. No. 768,013 filed Sep. 30, 1991, now pending.

The invention relates to an apparatus for the heat treatment and the transport of substrates in vacuum coating apparatus with a plurality of stations. Substrate holders of an approximately plate-like, flat configuration are driven in the vertical position through the stations along a given transport path, and have rails which cooperate with pairs of rollers, slide blocks or wheels provided below the substrate holders. The substrate holders have side parts of frame-like configuration arranged in parallel planes, in whose window-like openings the substrates can be inserted, in accordance with U.S. Pat. No. 5,097,794.

The substrate holders that are used are either plates with openings shaped to match the substrates, or frames with crosspieces to which the substrates are fastened. In general, a substrate holder serves to accommodate a plurality of substrates.

U.S. Pat. No. 4,042,128 discloses a transport system of the kind described above, in which plate-like substrate holders are carried with their principal plane in the vertical position by their top and bottom longitudinal edges between wheels which rotate about vertical axes. At their bottom edges the substrate holders additionally lie on supporting wheels with a horizontal axis of rotation. The lower guiding wheels are not capable of holding and transporting the substrate holders in a precisely vertical position, so that stable positioning is possible only by means of the upper guiding wheels.

U.S. Pat. No. 4,765,273 discloses a transport system for vacuum coating apparatus with several stations and with wheel systems for the guidance and advancement of substantially bidimensional substrate holders in a vertical position along a given transport path through the stations. Guide wheels are disposed in pairs at the bottom edge of the substrate holders and rotate about vertical axes, accommodating the substrate holder between them. The substrate holders are guided by the wheel systems only at their bottom edge. The guiding wheel of a pair and are disposed one at the bottom and one at the upper end. The other guiding wheel of the same pair has at least one tread surface, and at least three tread surfaces per pair of wheels provide a grip on the substrate holder to secure it against tilting.

U.S. Pat. No. 4,426,267 discloses heat treating the substrates that are to be coated, using a heating system in a special lock chamber. It has also been proposed to equip the substrate holder, in a transport system for a vacuum coating apparatus, with a shank which rides on stationary rails (EP O 346 815).

The apparatus according to U.S. Pat. No. 5,097,794, the entire disclosure of which is incorporated herein by reference, has several stations, and substrate holders of an approximately plate-like, flat, parallelepipedal configuration which can be driven in the perpendicular position along a given transport path through the stations. These substrate holders cooperate with rails which are provided in the area of their shank underneath the substrates fastened to the substrate holders. The shank of the substrate holder is provided with a pair of parallel rails running at a distance apart from one another and disposed in a perpendicular plane. The narrow, confronting edges of these rails have longitudinal grooves which correspond to wheels or slide blocks fixedly mounted on the bottom of the apparatus. These wheels or blocks are provided in rows, corresponding to the configuration of the grooves, in vertical planes situated one above the other at a distance apart from one another. The substrate holder has a narrow channel extending downward parallel to the rails, all the way to the area of its shank. A heating body, disposed on the upper wall above the substrate holder and configured as a resistance heater, extends vertically downward into this channel during passage through a coating station.

This older transport system was addressed to the problem of creating a substrate holder for a plurality of substrates and configuring it so that the substrates could be heated simultaneously by a single heat source and with the same intensity.

The invention according to U.S. Ser. No. 768,013, the entire disclosure of which is incorporated herein by reference, is addressed to improving the electrical and the optical coating properties of coatings on non-heat-resistant substrates by tempering, and configuring the apparatus such that the temperature in the environment of the substrates remains comparatively low.

SUMMARY OF THE INVENTION

The present invention aims to improve the apparatus of U.S. Pat. No. 5,097,794 such that, in the case of substrates which consist of an electrically insulating material, and on which a thin coating of an electrically conductive material is applied, this coating can be heated especially rapidly to temper it. This is done without markedly heating the substrate itself, and without damaging a substrate that is especially sensitive to electromagnetic fields.

This purpose is achieved by providing wiping contacts on stationary mountings, whose resilient ends lie each against the electrically conductive coating during movement through the station, while a circuit can be closed briefly through this wiping contact and the coating to produce a heating of the coating and thus a tempering of the material of the coating.

BRIEF DESCRIPTION OF THE DRAWING

The sole figure is an end section view of the apparatus.

DETAILED DESCRIPTION OF THE PREFERRED EMBODIMENT

As the drawing shows, the apparatus consists of the wheels 7 and 8 journaled on horizontally disposed arms 5 and 6 on the one side wall 4a of the housing 4 in the coating chamber 3, the two cathodes 9 and 10 affixed to the side walls 4a and 4b, , the wiping contacts 29 and 29a held on the upper end wall 4c and on the insulator 27 with the corresponding conductors 12 and 12a, the shank 15 of the substrate holder 16 of U-shaped cross section provided with the rails 13 and 14, the two frame-like side parts 16a and 16b of the substrate holder 16 which hold the substrates 22 and 23, the two insulators or posts 28 and 28a with the wiping contacts 30 and 30a fastened to them, the cathode masks 17 and 18, and lastly the connection 21 for a turbomolecular pump not further indicated.

During operation of the coating station schematically represented in the drawing, the substrates 22 and 23 are driven in a direction perpendicular to the plane of drawing until they are opposite the cathodes 9 and 10, as can be seen in the drawing.

After the outer surfaces 22a and 23a of the substrates 22 and 23 have been coated they are moved on in the same direction (perpendicular to the plane of drawing) to the next working station. The disk-like substrates 22 and 23 are held by the side parts 16a and 16b of the substrate holder 16 surrounding them in a frame-like manner, and the substrate holder 16 is in turn permanently joined to the shank 15 or made integral with the latter. Two rails 13-14 are screwed or welded to the shank 15 and have longitudinal grooves 13a and 14a in which wheels 7 and 8 run, which are journaled in two rows at intervals apart. The distance at which the rows of wheels 5 and 6 are apart from one another is selected so that the shank 15 is held and guided in a stable manner thereon.

To assure that the substrate coatings 22a and 23a are at the temperature required for the tempering process, wiping contacts 29 and 29a are fastened on the upper end wall 4c of the housing 4 on an insulator or post 27 such that their free ends resiliently contact the coating 22a and 23a, respectively, when the substrates 22 and 23 are in the area of the station with their substrate mounting 16. At the same time, the wiping contacts 30 and 30a come in contact with the coating 22a and 23a (e.g. indium-tin oxide coating), so that a current can pass through the coating 22a, 23a, to cause the coatings to heat.

An important advantage of the described apparatus consists especially in the fact that the heat to be applied is produced only in the moment when the substrate 22, 23 is directly in reach of the wiping contacts 12, 12a and 30, 30a , respectively, so that the apparatus itself does not become any warmer and the heat, locally defined, can be controlled especially well (e.g. a substrate of "Plexiglas" can be exposed only to a maximum temperature of 100° C.). The substrate itself is not exposed to any electromagnetic fields during tempering. The current required for heating the coating (e.g., an ITO coating) can best be "pulsed," i.e., only briefly and in portions (in the range of a few seconds). It is clear that either alternating current or direct current pulses can be used. Also a heating current of high frequency (e.g., in the kHz range) has proven desirable. The tempering can be performed either under a vacuum or in a gas atmosphere under a certain pressure.

I claim:

1. Apparatus for transporting substrates along a path through a vacuum coating system having several coating stations, each said substrate having a first face which is provided with an electrically conductive coating and an opposed face, said apparatus comprising a housing, at least one pair of wiping contacts fixed to said housing at each coating station, electrical power supply means for supplying current through each said pair of wiping contacts when a circuit between said each pair of contacts is closed, and transport means for transporting a substrate on said path through said coating stations so that said first face is contacted by the pair of wiping contacts at each coating station, whereby an electrical current can be provided through a conductive coating on said first face in order to heat said coating.

2. Apparatus as in claim 1 wherein said transport means comprises first sliding means extending through said housing parallel to said path past said coating stations, second sliding means extending through said housing parallel to said path past said coating stations, said second sliding means being spaced vertically below said first sliding means, and a substrate holder comprising a foot part which carries a pair of parallel rails having respective mutually facing grooves which are vertically spaced to engage respective first and second sliding means.

3. Apparatus as in claim 1 wherein said transport means comprises a substrate holder having two parallel side parts in which said substrates are received with their first faces opposed, each said coating station having two pairs of wiping contacts arranged on respective opposite sides of said path to contact first faces of two respective substrates.

* * * * *